United States Patent
Ciccone et al.

(10) Patent No.: US 6,348,882 B1
(45) Date of Patent: Feb. 19, 2002

(54) 5-ARY RECEIVER UTILIZING COMMON MODE INSENSITIVE DIFFERENTIAL OFFSET COMPARATOR

(75) Inventors: John Charles Ciccone, Scottsdale; D.C. Sessions, Phoenix; Carl Liepold, Chandler, all of AZ (US)

(73) Assignee: Philips Electronics North America Corporation, Tarrytown, NY (US)

( * ) Notice: Subject to any disclaimer, the term of this patent is extended or adjusted under 35 U.S.C. 154(b) by 0 days.

(21) Appl. No.: 09/625,084

(22) Filed: Jul. 25, 2000

(51) Int. Cl.[7] ................................................ H03M 5/20
(52) U.S. Cl. ......................................... 341/56; 375/288
(58) Field of Search ............................. 341/56; 375/286, 375/287, 288, 289, 290, 291, 292, 293, 294

(56) References Cited

U.S. PATENT DOCUMENTS

| | | | | |
|---|---|---|---|---|
| 4,382,249 A | * | 5/1983 | Jacobsthal | 341/56 |
| 5,325,355 A | | 6/1994 | Oprescu et al. | 370/24 |
| 5,512,848 A | | 4/1996 | Yaklin | 327/65 |
| 5,517,134 A | | 5/1996 | Yaklin | 327/65 |
| 5,563,598 A | | 10/1996 | Hickling | 341/155 |
| 5,614,852 A | | 3/1997 | Giordano et al. | 327/63 |
| 5,740,201 A | * | 4/1998 | Hui | 375/286 |
| 5,946,355 A | * | 8/1999 | Baker | 375/286 |
| 6,226,330 B1 | * | 5/2001 | Mansur | 375/288 |

* cited by examiner

*Primary Examiner*—Howard L. Williams
(74) *Attorney, Agent, or Firm*—Wells, St. John, Roberts, Gregory & Matkin, P.S.

(57) ABSTRACT

A signal converter is provided for converting multiple level encoded digital signals into a binary equivalent signal. The signal converter includes a reference voltage generator, a plurality of four-input differential comparators, timing recovery circuitry, and signal conversion circuitry. The reference voltage generator is operative to generate a plurality of progressively larger differential reference voltages. The plurality of differential comparators are each operative to compare magnitude of a differential input voltage with magnitude of a dedicated one of the progressively larger differential reference voltages and produce a differential output voltage having a first logical sense if the magnitude of the differential input voltage is greater than the magnitude of the differential reference voltage, and having a second logical sense if the magnitude of the differential input voltage is less than the magnitude of the differential reference voltage. Each comparator has an offset input voltage. The timing recovery circuitry is configured to receive the differential output voltages from each of the differential comparators and is operative to derive a clock via edge detection and generate a recovered clock signal. The signal conversion circuitry is coupled with the timing recovery circuitry and the differential comparators and is operative to convert the differential output voltages into a binary equivalent. A method is also provided.

26 Claims, 5 Drawing Sheets

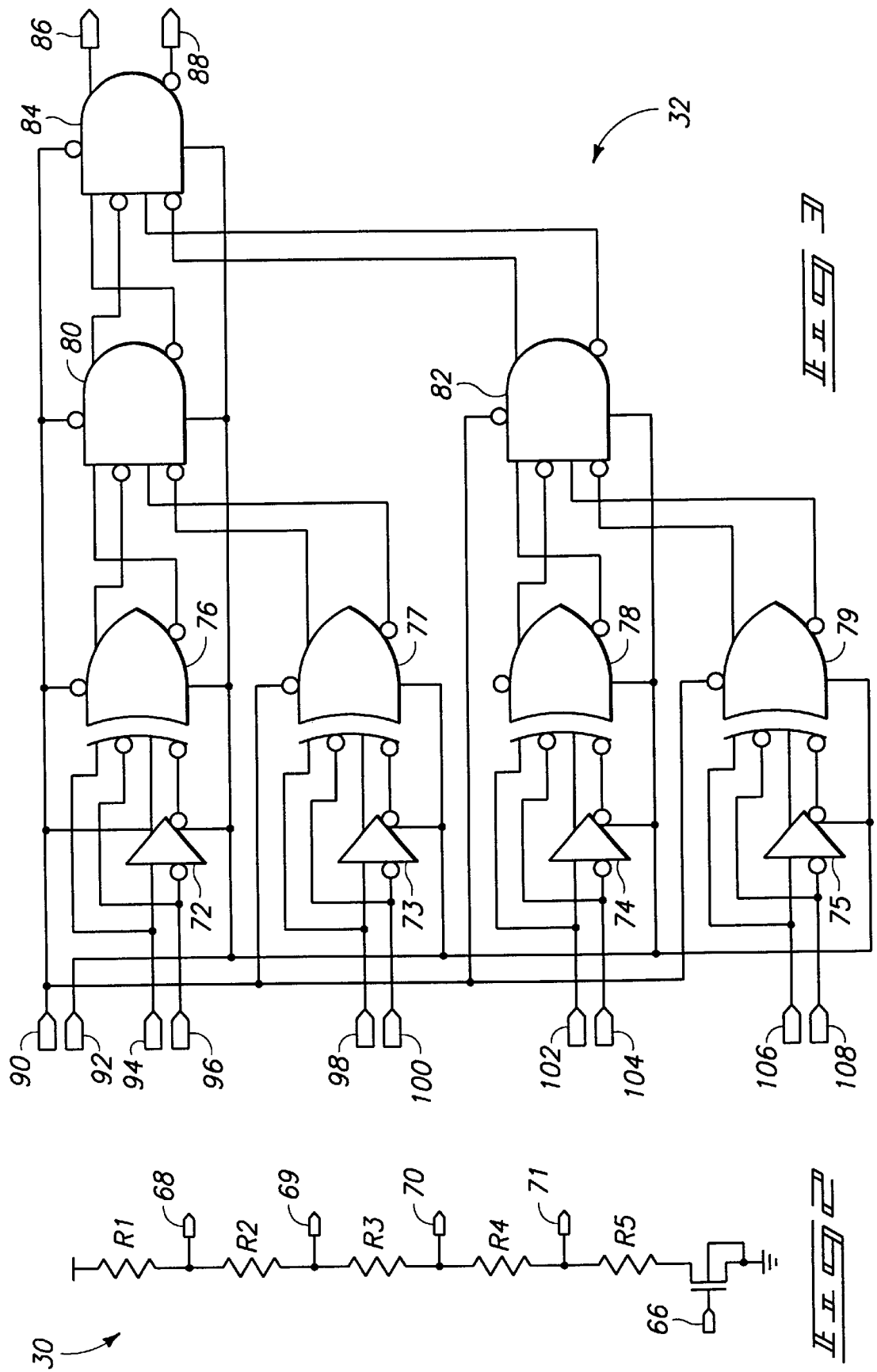

5-ARY RECEIVER UTILIZING COMMON MODE INSENSITIVE DIFFERENTIAL OFFSET COMPARATOR

TECHNICAL FIELD

The present invention relates generally to signal and data transmission technology and, more particularly, to multiple level encoding and the conversion of encoded digital signals into binary equivalents.

BACKGROUND OF THE INVENTION

Signal transmission of data at high frequency rates, such as at exemplary rates of $4 \times 10^9$ bits/second, can generate problems. At such high frequency rates, line losses are higher. Secondly, electromagnetic interference (EMI) is generally higher. High line losses and high EMI tend to be undesirable consequences of high frequency data transmission rates. In contrast, jitter tends to be worse when clock power is relatively low. However, increased levels of clock power tend to correspond with relatively high frequency data transmission rates. Hence, attempts to achieve relatively low line loss and reduced EMI, in combination with reduced jitter, appear to present a conflict where traditional signal transmission techniques are employed.

Accordingly, a compromise is needed that enables the realization of relatively low line losses and reduced EMI while, at the same time, realizing reduced jitter. One technique involves the use of multiple level signaling schemes.

SUMMARY OF THE INVENTION

A system is provided for converting a multiple level encoded digital signal into a binary equivalent. A system of differential comparators are used to compare a differential input signal for purposes of extracting multiple level coding.

According to one aspect of the invention, a signal converter is provided for converting multiple level encoded digital signals into a binary equivalent. The signal converter includes a reference voltage generator, a plurality of differential comparators, error recovery circuitry, and signal conversion circuitry. The reference voltage generator is operative to generate a plurality of progressively larger differential reference voltages. The plurality of differential comparators are operative to compare a differential input voltage with the reference voltages and produce differential output voltages having first logical senses if the input voltage is greater than the reference voltages, and having second logical senses if the input voltage is less than the reference voltages, respectively. Furthermore, each comparator has an offset input voltage. The error recovery circuitry is configured to receive the differential output voltages from the differential comparators, and is operative to recover the clock via edge detection and generate a recovered clock signal. The signal conversion circuitry is coupled with the error recovery circuitry and the differential comparators, and is operative to convert the differential output voltages into a three-bit binary equivalent.

According to one aspect, a signal converter is provided for converting multiple level encoded digital signals into a binary equivalent signal. The signal converter includes a reference voltage generator, a plurality of four-input differential comparators, timing recovery circuitry, and signal conversion circuitry. The reference voltage generator is operative to generate a plurality of progressively larger differential reference voltages. The plurality of differential comparators are each operative to compare magnitude of a differential input voltage with magnitude of a dedicated one of the progressively larger differential reference voltages and produce a differential output voltage having a first logical sense if the magnitude of the differential input voltage is greater than the magnitude of the differential reference voltage, and having a second logical sense if the magnitude of the differential input voltage is less than the magnitude of the differential reference voltage. Each comparator has an offset input voltage. The timing recovery circuitry is configured to receive the differential output voltages from each of the differential comparators and is operative to derive a clock via edge detection and generate a recovered clock signal. The signal conversion circuitry is coupled with the timing recovery circuitry and the differential comparators and is operative to convert the differential output voltages into a binary equivalent.

According to another aspect of the invention, a method is provided for converting an (N+1)-level encoded digital signal into a binary equivalent signal. The method includes: generating N progressively larger differential reference signals; comparing the (N+1)-level differential input signal with each of the N reference signals; for each compared N reference signal, producing a differential output signal having first logical senses if the input signal is greater than the reference signal and having second logical senses if the input signal is less than the reference signal; generating a clock by edge detecting the N differential output signals so as to recover a clock signal; and converting the N differential output signals into a binary equivalent signal.

BRIEF DESCRIPTION OF THE DRAWINGS

Preferred embodiments of the invention are described below with reference to the following accompanying drawings.

FIG. 2 is a circuit schematic of reference voltage generation circuitry corresponding to one of the blocks of FIG. 1 and configured to generate four differential reference voltages.

FIG. 3 is a circuit schematic of edge detection circuitry corresponding to one of the blocks of FIG. 1 and configured to implement clock-recovery.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method and an apparatus for converting a five level encoded digital signal into a binary equivalent are disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

Figure 1:
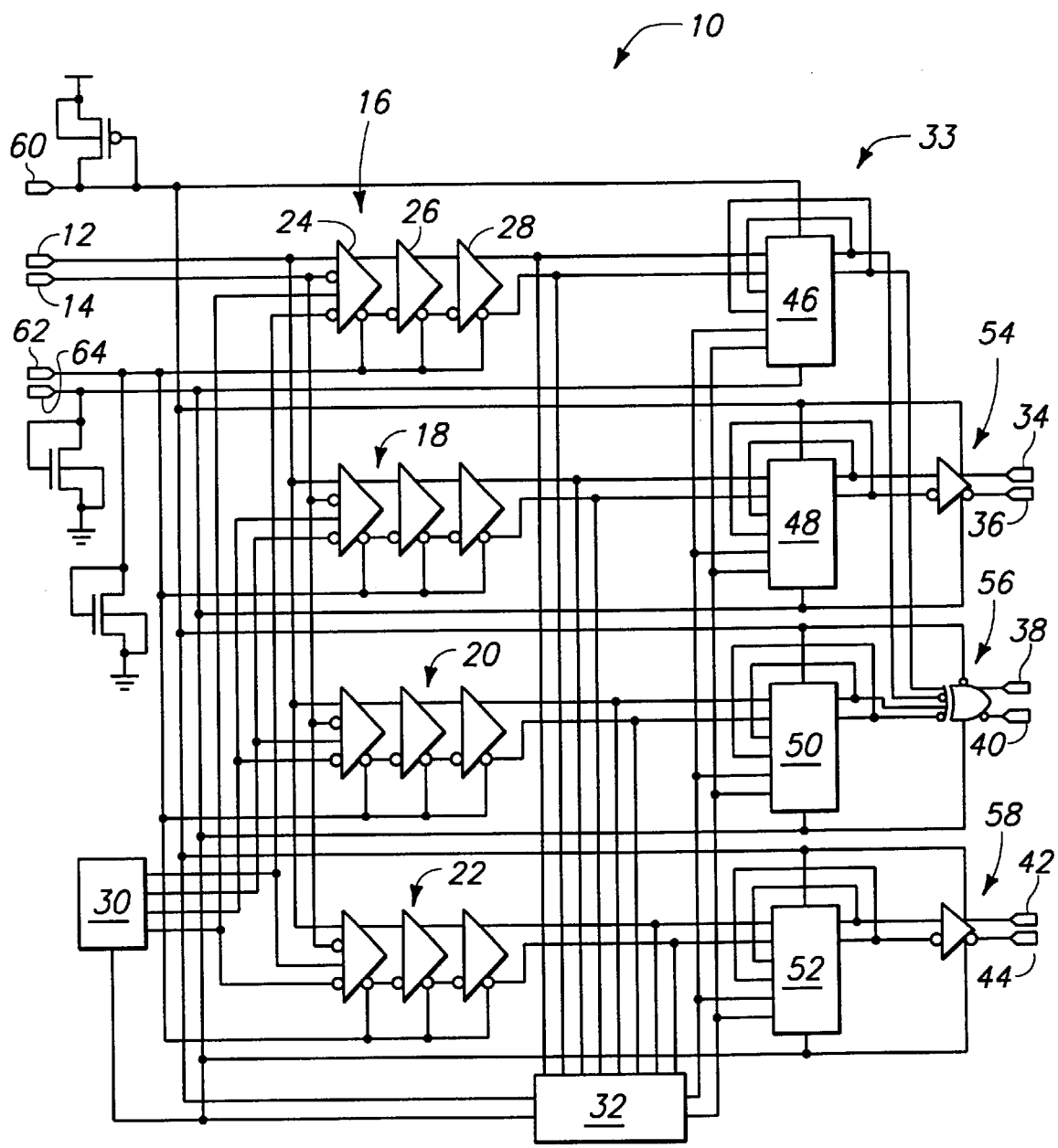
FIG. 1 is an illustration of a voltage comparator circuit and partial block diagram used to compare a five level differential input signal to four separate differential reference voltages in accordance with the teachings of the present invention.
Figure 4:
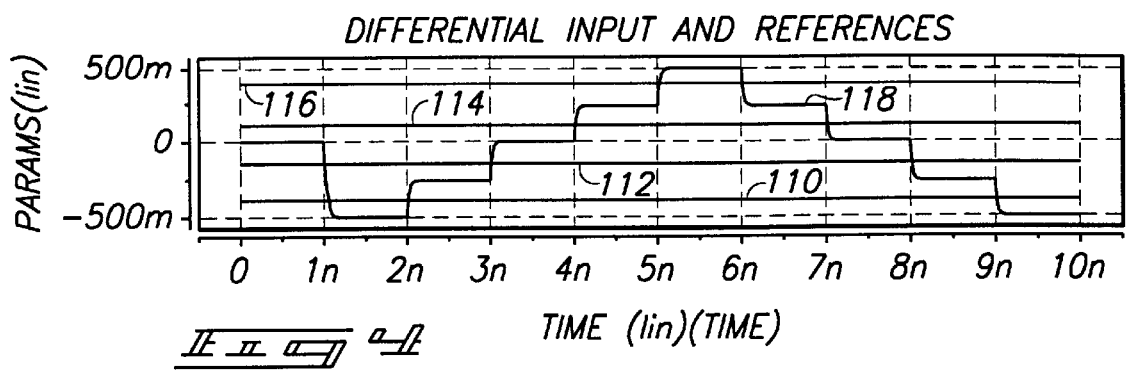
FIG. 4 is a plot of a first simulation sheet illustrating the five possible differential input voltages and the four differential reference voltages generated by the reference voltage generation circuitry of FIG. 2.

FIG. 1 illustrates a voltage comparator circuit and partial block diagram indicated by reference numeral 10 and used to compare a five level differential input signal to four separate differential reference voltages in accordance with the teachings of the present invention. A pair of input leads 12 and 14 deliver a differential input voltage to each of four differential comparator circuits 16, 18, 20 and 22. Each differential comparator circuit 16, 18, 20 and 22 comprises a common mode insensitive differential offset comparator 24, a first comparator amplifier 26 and a second comparator amplifier 28. Differential comparator circuits 16, 18, 20 and 22, via common mode insensitive differential offset comparator 24, are configured to compare a five level differential input signal delivered via input leads 12 and 14 with four separate differential reference voltages generated by a reference voltage generator 30. The four differential reference voltages are generated to deliver progressively larger differential reference voltages to comparator circuits 16, 18, 20 and 22, respectively. These progressively larger differential reference voltages are configured to be intermediate in magnitude to the five possible differential input voltages. FIG. 4 illustrates each of the differential reference voltages superimposed with a stair stepped exemplary differential input signal that illustrates each level of the five level differential input signal.

Figure 12:
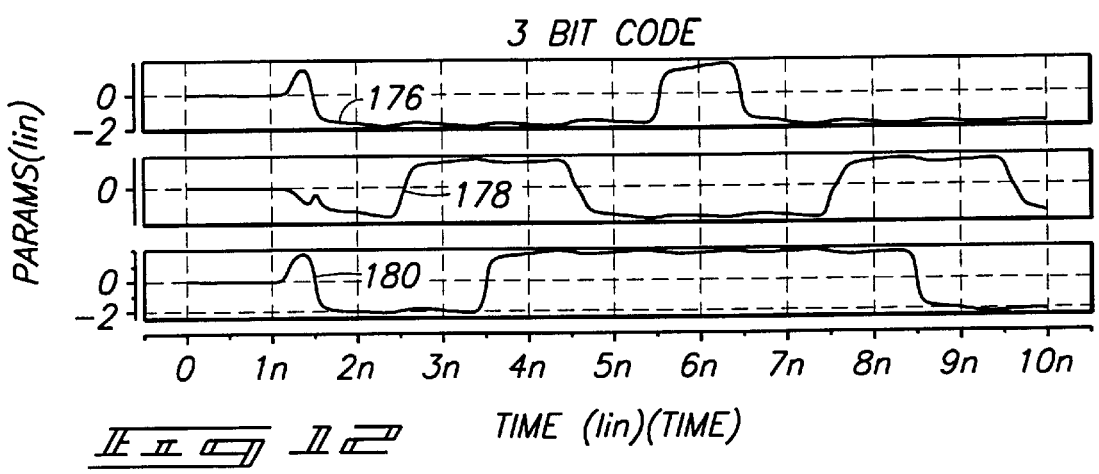
FIG. 12 is a plot of three-bit binary equivalents generated by the conversion of the four bit comparator outputs comprising the four drive latches of FIG. 11 which are used to feed two buffers and an exclusive-or (XOR) gate.

Comparator circuits 16, 18, 20 and 22 include comparator amplifiers 26 and 28 which amplify, in stages, the output signals from each circuit. Such output signals are input to respective latches 46, 48, 50 and 52 of signal conversion circuitry 33. Latches 46 and 50 are configured to feed an "exclusive-or" (XOR) gate 56; whereas latches 48 and 52 feed dedicated buffers 54 and 58, respectively. Buffers 54 and 58 and XOR gate 56 cooperate to convert four single-bit comparator outputs to three-bit binary equivalents. FIG. 12 illustrates such conversion as described below.

As shown in FIG. 1, a differential input voltage is delivered via input leads 12 and 14 to comparator 24 of each comparator circuit 16–20. Additionally, a differential reference voltage is delivered from reference voltage generator 30 to comparator 24 of each comparator circuit 16–20. Comparator 24 produces a differential output voltage, with equal bias currents provided for an input signal differential NMOS pair and a reference input differential NMOS pair of comparator 24. An input differential voltage magnitude $\Delta I=V(I)-V(IN)$ is compared to a reference differential voltage magnitude $\Delta R=V(R)-V(RN)$, where $\Delta I$ is the input differential voltage magnitude provided by input leads 12 and 14, and $\Delta R$ is the reference differential voltage magnitude input to each comparator 24 from reference voltage generator 30. If the differential input voltage magnitude is greater than the differential voltage magnitude, $\Delta I>\Delta R$, the differential input voltage magnitude will be positive, $\Delta Z=V(Z)-V(ZN)>0$.

Comparator 24 is implemented with low gain NMOS differential pairs such that neither the input nor the reference NMOS differential pair is saturated, i.e. all four differential NMOS transistors are operating in MOSFET saturation. Furthermore, the common mode voltage of the input signal need not be the same as the common mode voltage of the reference voltage.

A positive biased differential comparator input signal (PBIASdc) is input via input lead 60 to error recovery circuitry 32 and latches 46–52. A negative biased offset comparator input signal (NBIASoc) is input via input lead 62 to comparators 24, 26 and 28 of comparator circuits 16–22. A negative biased differential comparator input signal (NBIASdc) is input via input lead 64 to latches 46–52.

In response to operation of voltage comparator circuit 10, a three-bit binary output signal is generated across pairs of output leads 34/36, 38/40 and 42/44 which corresponds to the five level differential input signal which is input at leads 12 and 14.

FIG. 2 illustrates a circuit schematic for reference voltage generation circuitry 30 (of FIG. 1). More particularly, circuitry 30 comprises a resistor ladder that forms a voltage divider circuit. An input signal is received via input lead 66 from error recovery circuitry 32 (see FIG. 1). A serial arrangement of resistors $R_1-R_5$ are configured to generate four differential reference voltages at output leads 68–71, respectively. Such differential reference voltages are generated with progressively larger differential reference voltages according to circuitry implementations already understood in the art.

FIG. 3 is a circuit schematic of edge detection circuitry comprising error recovery circuitry 32 (see FIG. 1). Error recovery circuitry is a differential logic circuit that keeps out common mode noise. Error recovery circuitry 32 is configured to implement clock-recovery which recovers the clock through edge detection. Error recovery circuitry 32 includes buffers 72–75, "exclusive-or" (XOR) gates 76–79, and four input NAND gates 80, 82 and 84. The output signals from NAND gates 80 and 82 are input to NAND gate 84. NAND gate 84 generates a pair of output signals, comprising logic positive (LP) and logic negative (LN), at output leads 86 and 88.

Error recovery circuitry 32 receives input signals from each differential comparator circuit 16, 18, 20 and 22 (of FIG. 1) via input lead pairs 92/94, 94/96, 98/100, 102/104 and 106/108, respectively. A corresponding output signal is delivered from output leads 86 and 88 to each latch 46, 48, 50 and 52 (of FIG. 1).

As shown in FIG. 1, error recovery circuitry 32 implements clock recovery through edge detection. More particularly, each of four amplified comparator circuits 16–22 are delayed and XORed with the original amplified comparator value. Hence, a "one-shot" is implemented on each of the four amplified comparator circuits 16–22. "One-shot" corresponds with an event, or change in input such as a voltage change, causing a single output pulse. The resulting four "one-shots" are then ORed via NAND gates 80, 82 and 84 (of FIG. 3) to implement clock-recovery.

FIG. 4 is a plot of a first simulation sheet illustrating the five possible differential input voltages and the four differential reference voltages generated by the reference voltage generation circuitry 30 (of FIG. 2). More particularly, a stair stepped (up and down) exemplary differential input voltage signal 118 is shown in order to illustrate the five possible differential input voltage values possible for an input signal being delivered via input leads 12 and 14 (of FIG. 1). Four differential reference voltage signals 110, 112, 114 and 116 are shown superimposed over exemplary input voltage signal 118, as generated by output leads 68–71, respectively, of reference voltage generator 30 (of FIG. 2). The four differential reference voltages of signals 110, 112, 114 and 116 are shown intermediate in magnitude to the five possible differential input voltages of exemplary signal 118.

Figure 5:
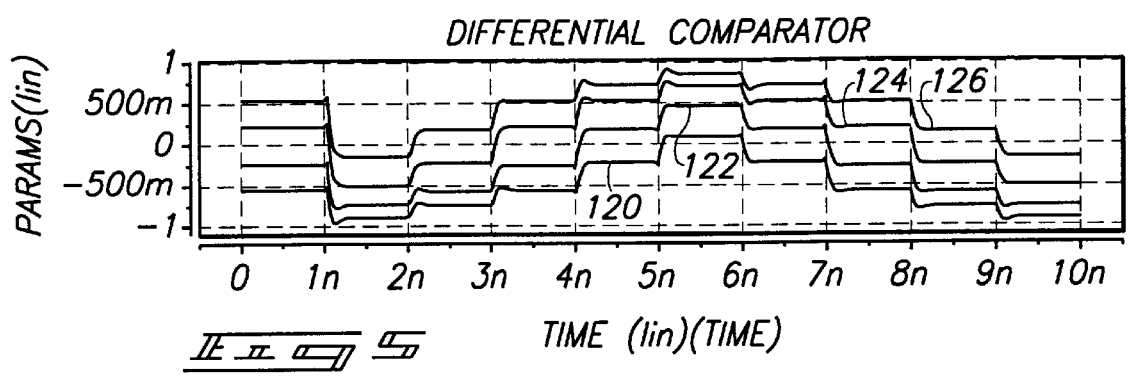
FIG. 5 is a plot of a first simulation sheet illustrating four outputs of the differential comparators of FIG. 1.

FIG. 5 is a plot of a first simulation sheet illustrating four output signals 120, 122, 124 and 126 from differential comparator circuits 16, 18, 20 and 22, respectively (of FIG. 1). If the differential input signal 118 (of FIG. 4) from input leads 12 and 14 (of FIG. 1) is greater in value than the differential reference voltage, paying attention to polarity of both the differential input and reference voltages, then the polarity of the corresponding comparator will be positive.

Figure 6:
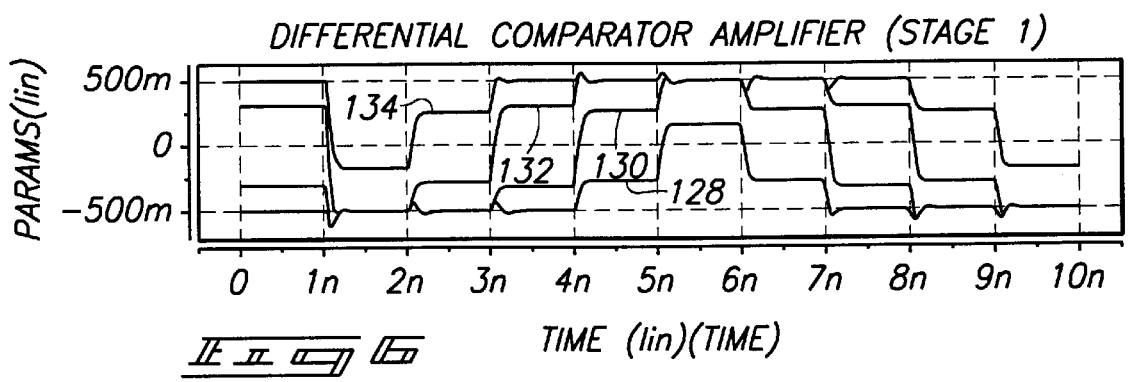
FIG. 6 is a plot of a first simulation sheet illustrating a first stage of two successive stages of amplification for a differential comparator amplifier.

FIG. 6 is a plot of a first simulation sheet illustrating a first stage of two successive stages of amplification for a differential comparator amplifier 26. Such first stage of amplification is implemented via comparator amplifier, or buffer circuit, 26 which generates an output to a second stage of amplification provided by comparator circuit 28.

Figure 7:
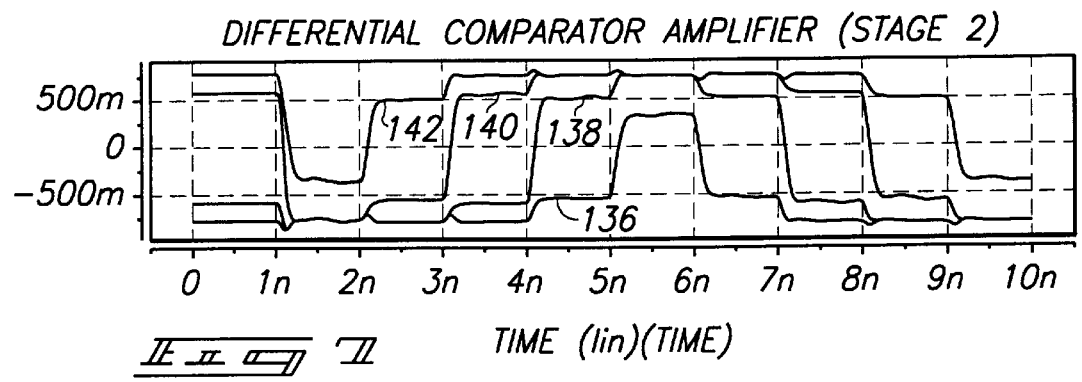
FIG. 7 is a plot of a first simulation sheet illustrating a second stage of two successive stages of amplification for a differential comparator amplifier.

FIG. 7 is a plot of a first simulation sheet illustrating a second stage of two successive stages of amplification for differential comparator amplifier, or buffer circuit, 28. Accordingly, comparator amplifiers 26 and 28 provide two successive stages of amplification within each comparator circuit 16, 18, 20 and 22.

Figure 8B:
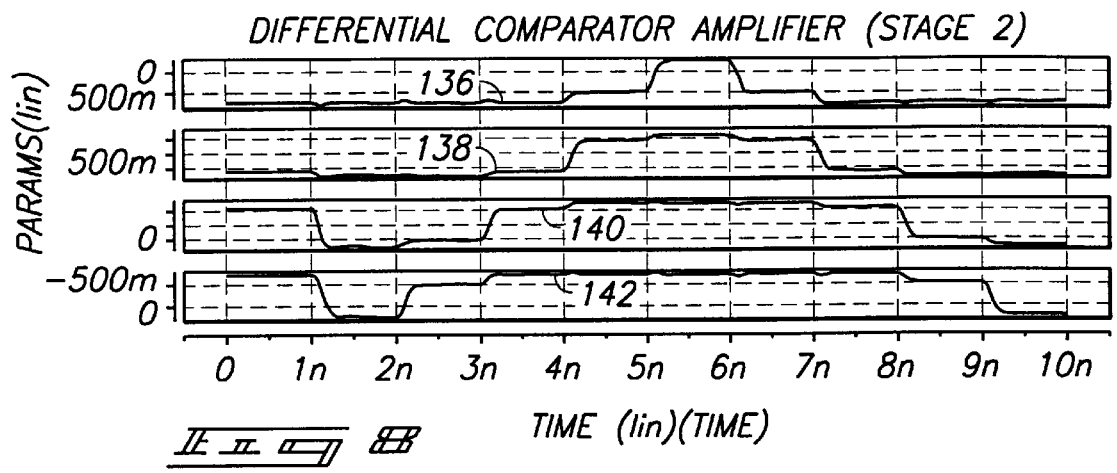
FIG. 8 is a plot of a second simulation sheet repeating the second stage amplified differential comparator amplifier signals of FIG. 7.

FIG. 8 is a plot of a second simulation sheet repeating the second stage amplified differential comparator amplifier signals of FIG. 7, but showing the signals separated and plotted to a different scale along the ordinate axis.

Figure 9:
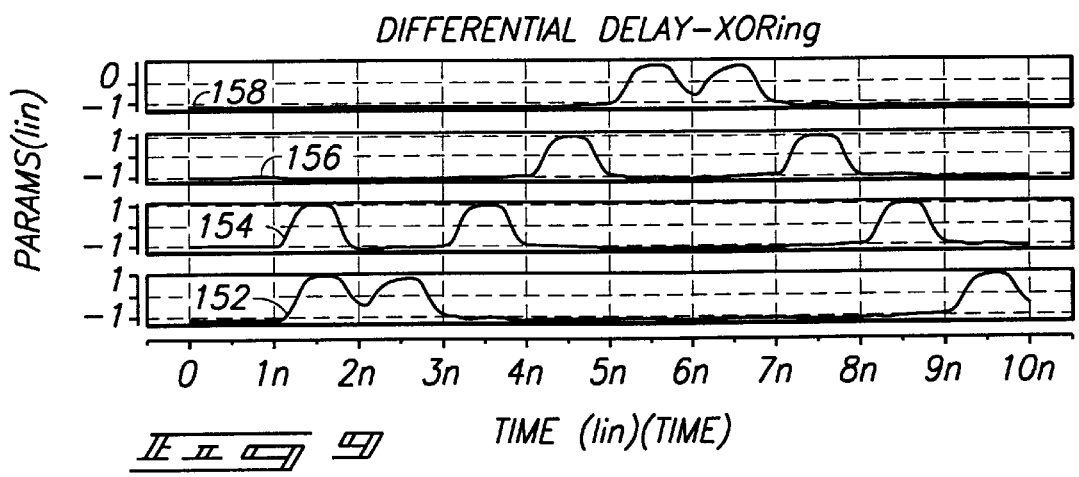
FIG. 9 is a plot of a second simulation sheet showing one-shot exclusive-or (XOR) outputs from differential delay.

FIG. 9 is a plot of a second simulation sheet showing one-shot exclusive-or (XOR) outputs 152, 154, 156 and 158 from XOR gates 76–79, respectively.

Figure 10:
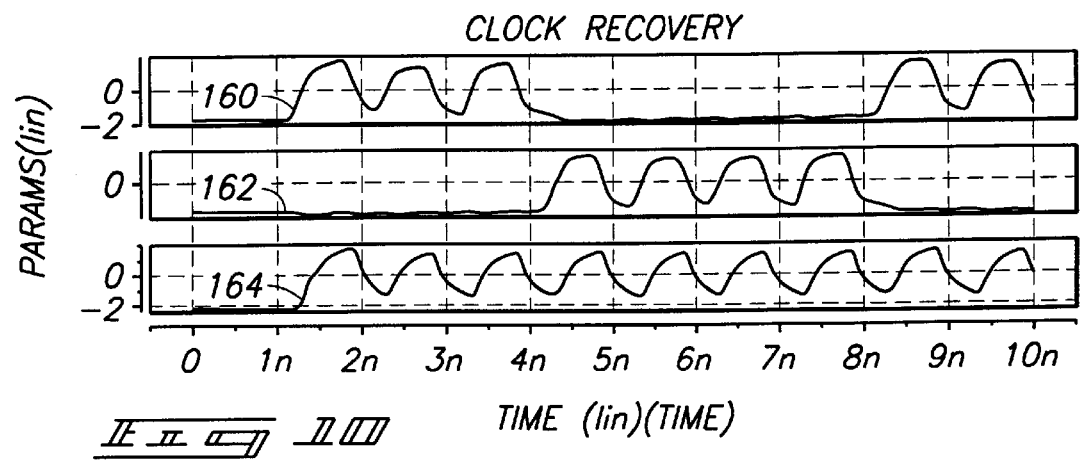
FIG. 10 is a plot of a second simulation sheet showing a resulting recovered clock implemented by the circuitry of FIG. 3.

FIG. 10 is a plot of a second simulation sheet showing a resulting recovered clock signal 164 implemented by error recovery circuitry 32 (of FIG. 3). Output signal 160 corresponds with the differential output signal from NAND gate 84 (of FIG. 3). Output signal 162 corresponds with the differential output signal from NAND gate 82 (of FIG. 3). Output signal 164 comprises output signals 160 and 162 ORed togther.

Figure 11:
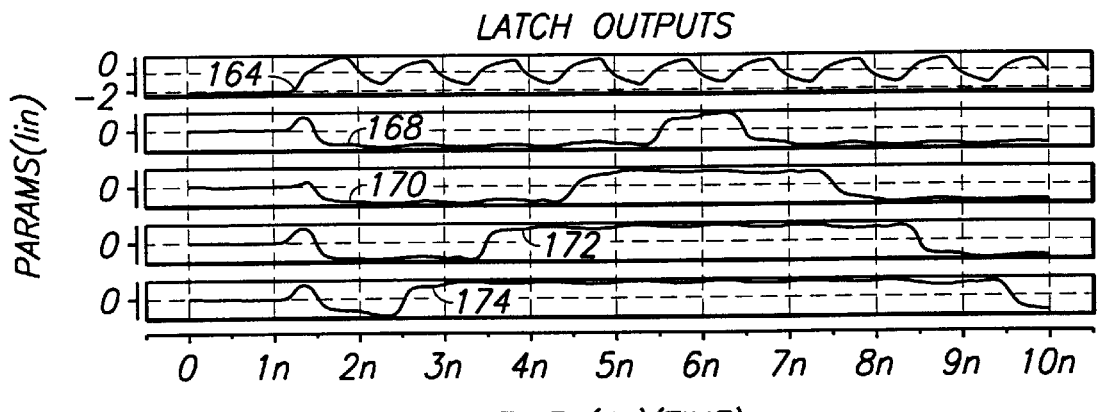
FIG. 11 is a plot of the recovered clock signal of FIG. 10 and further illustrating four latch outputs that are driven by the recovered clock signal.

FIG. 11 is a plot of the recovered clock signal 164 as shown above in FIG. 10, and further illustrating four latch outputs 168, 170, 172 and 174 that are driven by the recovered clock signal. More particularly, latch outputs 168, 170, 172 and 174 are generated by latches 46, 48, 50 and 52, respectively (see FIG. 1).

FIG. 12 is a plot of three-bit binary equivalent signals 176, 178 and 180 generated by the conversion of the four bit comparator outputs comprising the four driven latch outputs 168, 170, 172 and 174 (of FIG. 11) which are used to feed two buffers 54 and 58 and an exclusive-or (XOR) gate 56 (of FIG. 1).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A signal converter for converting multiple level encoded digital signals into a binary equivalent signal, comprising:

a reference voltage generator operative to generate a plurality of progressively larger differential reference voltages;

a plurality of four-input differential comparators, each comparator operative to compare magnitude of a differential input voltage with magnitude of a dedicated one of the progressively larger differential reference voltages and produce a differential output voltage having a first logical sense if the magnitude of the differential input voltage is greater than the magnitude of the differential reference voltage, and having a second logical sense if the magnitude of the differential input voltage is less than the magnitude of the differential reference voltage, respectively, and wherein each comparator has an offset input voltage;

timing recovery circuitry configured to receive the differential output voltages from each of the differential comparators and operative to derive a clock via edge detection and generate a recovered clock signal; and signal conversion circuitry coupled with the timing recovery circuitry and the differential comparators and operative to convert the differential output voltages into a binary equivalent.

2. The signal converter of claim 1 wherein the reference voltage generator comprises a voltage divider circuit.

3. The signal converter of claim 1 wherein the reference voltage generator comprises a series resistor network operative to generate a plurality of differential output voltages.

4. The signal converter of claim 1 wherein each differential comparator comprises a common-mode insensitive differential offset comparator.

5. The signal converter of claim 1 wherein, for each differential comparator, when the differential input signal is greater in value than the differential reference voltage, the polarity of the respective comparator will be positive.

6. The signal converter of claim 1 wherein the timing recovery circuitry is adapted to recover a clock signal via edge detection.

7. The signal converter of claim 1 wherein the timing recovery circuitry comprises at least one comparator, delay circuitry and logic circuitry.

8. The signal converter of claim 7 wherein the logic circuitry comprises an XOR gate, the at least one comparator comprises a plurality of amplified comparators configured to receive and amplify the differential output voltage from one of the differential comparators to produce an amplified differential output voltage, the delay circuitry adapted to delay the amplified differential output voltage, and the XOR gate adapted to logically compare the delayed, amplified differential output voltage with the differential output voltage.

9. The signal converter of claim 8 wherein the logic circuitry further comprises at least one OR gate signal coupled with a pair of the comparators and operative to implement clock recovery.

10. The signal converter of claim 1 wherein the signal conversion circuitry comprises a plurality of latches, each latch configured to receive the differential output voltage from one of the differential comparators, and the recovered clock signal, and generate an output signal.

11. The signal converter of claim 10 wherein the plurality of differential comparators comprises four four-input comparators, the plurality of latches comprises four latches, and the signal conversion circuitry further comprises a pair of buffers and an exclusive-or (XOR) gate, one of the buffers configured to receive an output signal from a first of the latches, another of the buffers configured to receive an output signal from a second of the latches, and the XOR gate configured to receive an output signal from each of a third and a fourth of the latches.

12. A digital-to binary signal conversion circuit, comprising:
- a reference signal generator operative to generate a plurality of progressively larger differential reference signals;
- a plurality of four-input differential comparators, each differential comparator configured to receive a dedicated one of the differential reference signals and operative to compare the difference between a differential input signal and the dedicated one of the differential reference signals and produce a differential output signal having a first logical value if the differential input signal is greater than the differential reference signal, and having a second logical value if the differential input signal is less than the differential reference signal;
- timing recovery circuitry configured to receive the differential output signals from the differential comparators and operative to generate a clock via edge detection that provides a recovered clock signal; and
- signal conversion circuitry coupled with the timing recovery circuitry and the differential comparators and operative to convert the differential output signal into a binary equivalent signal.

13. The conversion circuit of claim 12 wherein the plurality of four-input differential comparators comprise four four-input differential comparators, each comparator receiving a dedicated one of a series of progressively larger differential reference signals, the differential comparators operative to detect the status of a five-level encoded digital signal from the differential input signal.

14. The conversion circuit of claim 12 wherein the signal conversion circuitry receives differential output voltages from each of the differential comparators and converts the differential output voltages into a binary equivalent.

15. The conversion circuitry of claim 12 wherein the timing recovery circuitry comprises clock recovery circuitry operative to implement clock recovery through edge detection of the differential output signals from each of the differential comparators.

16. The conversion circuit of claim 12 wherein the reference voltage generator comprises circuitry operative to generate a plurality of differential output voltages.

17. The conversion circuit of claim 12 wherein each of the four-input differential comparators comprises a common-mode insensitive differential offset comparator.

18. The timing recovery circuitry comprises logic circuitry configured to receive inputs from the plurality of differential comparators.

19. The conversion circuit of claim 18 wherein the logic circuitry comprises an XOR gate.

20. A signal converter for converting an (N+1)-level encoded digital input signal into a binary equivalent signal, comprising:
- a reference signal generator operative to generate N progressively larger differential reference signals;
- N common-mode insensitive differential offset comparators each operative to compare an (N+1)-level differential input signal with one of the N separate differential reference signals and produce a differential output signal having first logical senses if the input signal is greater than the reference signal, and having second logical senses if the input signal is less than the reference signal;
- edge detection circuitry configured to receive the N differential output signals from the differential comparators and operative to recover the clock via edge detection and generate a recovered clock signal; and
- signal conversion circuitry coupled with the edge detection circuitry and the differential comparators and operative to convert the differential output signals into a binary equivalent signal.

21. The signal converter of claim 20 wherein the edge detection circuitry provides clock recovery circuitry that receives input signals from a plurality of differential offset comparators.

22. The signal converter of claim 20 wherein the reference signal generator is a reference voltage generator that generates N progressively larger differential reference signals, and the input signal comprises a differential input voltage.

23. A method for converting an (N+1)-level encoded digital signal into a binary equivalent signal, comprising:
- generating N progressively larger differential reference signals;
- comparing the (N+1)-level differential input signal with each of the N reference signals;
- for each compared N reference signal, producing a differential output signal having first logical senses if the input signal is greater than the reference signal and having second logical senses if the input signal is less than the reference signal;
- generating a clock by edge detecting the N differential output signals so as to recover a clock signal; and
- converting the N differential output signals into a binary equivalent signal.

24. The method of claim 23 wherein the clock is generated using clock recovery circuitry that receives input signals from a plurality of differential offset comparators.

25. The method of claim 23 wherein the reference signal generator is a reference voltage generator that generates N progressively larger differential reference signals, and the input signal comprises a differential input voltage.

26. The method of claim 23 wherein clock generation is performed using timing recovery circuitry that receives differential output voltages from each of a plurality of the four-input differential comparators.

* * * * *